(12) United States Patent
Park et al.

(10) Patent No.: US 9,933,500 B2
(45) Date of Patent: Apr. 3, 2018

(54) RADIO FREQUENCY COIL STRUCTURE AND ASSEMBLY, AND MRI APPARATUS USING THE SAME

(71) Applicant: Samsung Electronics Co., Ltd., Gyeonggi-do (KR)

(72) Inventors: Seul Gi Park, Seoul (KR); Seong Ho Yoon, Gyeonggi-do (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 605 days.

(21) Appl. No.: 14/475,925

(22) Filed: Sep. 3, 2014

(65) Prior Publication Data

US 2015/0168512 A1 Jun. 18, 2015

(30) Foreign Application Priority Data

Dec. 17, 2013 (KR) ........................ 10-2013-0157265

(51) Int. Cl.
*G01R 33/34* (2006.01)
*G01R 33/36* (2006.01)
*G01R 33/3415* (2006.01)

(52) U.S. Cl.
CPC ....... *G01R 33/365* (2013.01); *G01R 33/3415* (2013.01)

(58) Field of Classification Search
CPC .... H01C 1/1271; H01C 1/36; G01R 33/3415; G01R 33/365; G01R 33/3685
See application file for complete search history.

(56) References Cited

U.S. PATENT DOCUMENTS

2005/0146331 A1    7/2005    Flexman et al.

FOREIGN PATENT DOCUMENTS

| CN | 103064045 A | 4/2013 |
|---|---|---|
| JP | 11-56813 A | 3/1999 |
| JP | 2006-14823 A | 1/2006 |

*Primary Examiner* — Baisakhi Roy
(74) *Attorney, Agent, or Firm* — Cha & Reiter, LLC

(57) ABSTRACT

Disclosed are a radio frequency (RF) coil assembly and a magnetic resonance imaging (MRI) apparatus using the RF coil assembly. The RF coil assembly includes a plurality of coils, and a plurality of distributed connecting elements to connect a first coil and a second coil of the coils. Each of the connecting elements is set to one of a short state and an open state. Isolation between the first coil and the second coil may vary depending upon the state of each of the connecting elements.

20 Claims, 17 Drawing Sheets

RADIO FREQUENCY COIL STRUCTURE AND ASSEMBLY, AND MRI APPARATUS USING THE SAME

CLAIM OF PRIORITY

This application claims the benefit of Korean Patent Application No. 10-2013-0157265, filed on Dec. 17, 2013 in the Korean Intellectual Property Office, the disclosure of which is incorporated herein by reference.

BACKGROUND

1. Field

Embodiments described herein relate to a radio frequency coil structure, a radio frequency coil assembly and a magnetic resonance imaging (MRI) apparatus having the same.

2. Description of the Related Art

An imaging apparatus produces an image of an external or internal part of an object using visible light, infrared light, ultrasound, radiation, nuclear magnetic resonance (NMR), or the like, and allows correcting the produced image by adjusting contrast or brightness of part or the entirety of the image when necessary. Examples of an imaging apparatus include an MRI apparatus, an ultrasonic imaging apparatus an X-ray imaging apparatus, a visible light camera and an infrared camera.

An MRI apparatus captures a cross-sectional image of an internal part of an object such as a human, an animal or a plant using the phenomenon of NMR. NMR refers to a phenomenon in which nuclei of an object resonate at a specific frequency of an electromagnetic wave applied thereto. The MRI apparatus may acquire a magnetic resonance image based on a free induction decay (FID) signal that a magnetization vector of a nucleus exposed to a magnetic field induces in a neighboring radio frequency (RF) coil.

SUMMARY

The present disclosure provides a radio frequency coil structure which may enhance isolation between radio frequency (RF) coils by economically and readily minimizing interference between the RF coils. Examples of an RF coil assembly and an MRI apparatus using the RF coil assembly are also disclosed.

In an embodiment, a radio frequency coil assembly includes a plurality of coils, and a plurality of distributed connecting elements to connect a first coil and a second coil of the coils. Each of the connecting elements is set to a short state or an open state. Isolation between the first coil and the second coil varies depending upon the state of each of the connecting elements.

Isolation between the first and second coils is higher due to the connecting elements, thereby reducing deleterious interference between signals carried by the respective coils.

A portion of the connecting elements may be set to the short state, and the other portion of the connecting elements may be set to the open state.

In various embodiments:

Any of the coils may have a circular, oval or polygonal shape.

The first and second coils may be arranged in non-overlapping relationship, with the connecting elements disposed in between the first and second coils.

At least one of the first coil and the second coil may be provided with a plurality of connecting elements facing outward.

Alternatively, the first and second coils overlap to define an overlapping region, and the connecting elements are disposed in the overlapping region.

At least one of the first coil and the second coil may be provided with a plurality of connecting elements facing inward.

The first coil and the second coil may overlap each other.

The connecting elements may be provided as a first set of tabs attached to and extending from the first coil, and a second set of tabs attached to and extending from the second coil. When a tab of the first series is bonded to a tab of the second series via a bonding element, these bonded tabs form a connecting element set to the short state.

The first strip may be disposed at the first coil to face the second coil, and the second strip may be disposed at the second coil to face the first coil.

The first strip and the second strip may be disposed at the first coil and the second coil such that the first strip and the second strip are alternated.

The first strip and the second strip may be disposed at the first coil and the second coil such that the first strip and the second strip face each other.

When the first strip and the second strip are bonded to each other, the connecting elements may be set to the short state.

The connecting elements may further include a bonding element to bond the first strip to the second strip.

The RF coil assembly may further including at least one of a capacitor connected to at least two coils of the plurality of coils and an inductor connected to at least two coils of the plurality of coils.

The plurality of coils may include at least one of a transmit coil, a receive coil and a transceive coil.

An MRI apparatus including the disclosed RF coil assembly is also disclosed. The MRI apparatus includes a static field coil unit to create a static field for an object, a gradient coil unit to create a gradient for the object, a transmit coil unit to apply an electromagnetic wave to an object subjected to the static field and the gradient to induce magnetic resonance in the object, and a receive coil unit to receive a magnetic resonance signal generated according to the induced magnetic resonance. The transmit coil unit and/or the receive coil unit includes a plurality of coils and a plurality of distributed connecting elements to connect a first coil and a second coil of the coils, each of the connecting elements being set to one of a short state and an open state.

Herein, isolation between the first coil and the second coil of the MRI apparatus varies depending upon the state of each of the connecting elements.

A part of the connecting elements of the MRI apparatus may be set to the short state, and the other part of the connecting elements may be set to the open state.

The magnetic resonance imaging apparatus comprises a helmet shaped radio frequency coil assembly which includes the plurality of coils.

The plurality of coils of the MRI apparatus has a circular shape, an oval shape, and a polygonal shape.

At least one of the first coil and the second coil may be provided with a plurality of connecting elements facing outward.

At least one of the first coil and the second coil of the MRI apparatus may be provided with a plurality of connecting elements facing inward.

The first coil and the second coil of the MRI apparatus may overlap each other.

The first strip of the MRI apparatus may be disposed at the first coil to face the second coil, and the second strip may be disposed at the second coil to face the first coil.

The first strip and the second strip of the MRI apparatus may be disposed at the first coil and the second coil such that the first strip and the second strip are alternated.

The first strip and the second strip of the MRI apparatus may be disposed at the first coil and the second coil such that the first strip and the second strip face each other.

When the first strip and the second strip of the MRI apparatus are bonded to each other, the connecting elements may be set to the short state. In this case, the connecting elements may further include a bonding element to bond the first strip to the second strip.

The magnetic resonance imaging apparatus may further including at least one of a capacitor connected to at least two coils of the plurality of coils and an inductor connected to at least two coils of the plurality of coils.

At least two coils of the plurality of coils of the MRI apparatus may overlap each other.

In accordance with another aspect of the present disclosure, a magnetic resonance imaging apparatus includes a static field coil unit to create a static field for an object, a gradient coil unit to create a gradient for the object, a radio frequency coil unit to apply an electromagnetic wave to an object subjected to the static field and the gradient to induce magnetic resonance in the object and to receive a magnetic resonance signal generated according to the induced magnetic resonance, wherein the radio frequency coil unit includes a plurality of coils and a plurality of distributed connecting elements to connect a first coil and a second coil of the coils, each of the connecting elements being set to one of a short state and an open state.

In accordance with a further aspect of the present invention, a radio frequency coil structure includes a plurality of coils, and a plurality of connecting elements to connect a first coil and a second coil of the coils, each of the connecting elements being set to one of a short state and an open state, wherein a capacitance value between the first coil and the second coil varies depending upon the state of each of the connecting elements.

BRIEF DESCRIPTION OF THE DRAWINGS

The above and/or other aspects of the disclosure will become apparent and more readily appreciated from the following description of the embodiments, taken in conjunction with the accompanying drawings of which.

DETAILED DESCRIPTION

Figure 1:
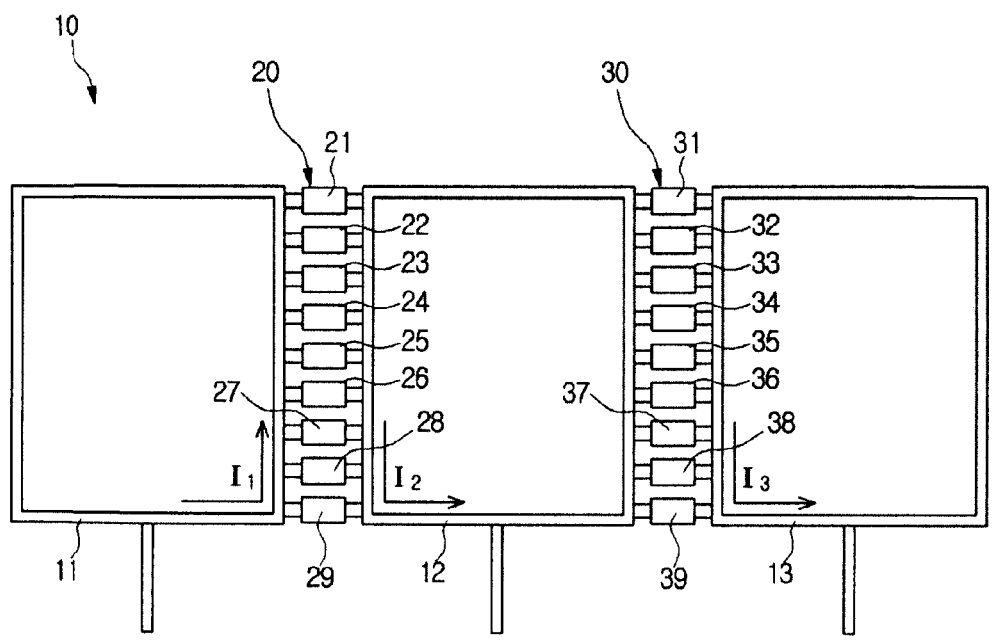
FIG. 1 is a view illustrating a radio frequency coil structure according to an exemplary embodiment.

Reference will now be made in detail to various embodiments of the present invention, examples of which are illustrated in the accompanying drawings, wherein like reference numerals refer to like elements throughout.

Hereinafter, examples of connecting a plurality of radio frequency coils through a plurality of connecting elements will be described with reference to FIGS. 1 to 9. In various examples, the RF coils may be used as a transmitting coil, a receiving coil, or as both a transmitting and a receiving coil (transceiver coil) of an MRI apparatus. Other applications are also possible.

FIG. 1 is a view illustrating a radio frequency (RF) coil structure, 10, according to an exemplary embodiment. RF coil structure 10 may include a plurality of coils 11, 12 and 13 and at least one connecting element 20 or 30 connecting two of the coils. In the example, connecting element 20 connects coils 11 and 12, and connecting element 30 connects coils 12 and 13. In the following description, any one coil connected to another coil by a connecting element may be called a first coil, and the other coil may be called a second coil. Connecting element 20 may include a plurality of distributed connecting elements 21 through 29; connecting element 30 may include a plurality of distributed connecting elements 31 through 39.

Currents I1 and I2 may flow through the first coil 11 and second coil 12, respectively. These currents I1 and I2 may be currents induced according to an external magnetic field. Currents I1 and I2 may be alternating current or direct current. Similarly, an induced current I3 due to the magnetic field may flow through the coil 13 neighboring the central coil 12 on the other side in this example configuration.

At least one of the first coil 11 and the second coil 12 may be a loop coil having a loop structure. Accordingly, a current flowing from a particular point in at least one of the first coil 11 and the second coil 12 may return to the particular point. For instance, current I1 flowing through coil 11 may produce an induced magnetic field, causing an undesirable interference current to flow within the adjacent coil 12 due to its close proximity to coil 11. The present embodiment may reduce such interference current via the provision of the connecting element 20, which may form an effective capacitance between the first and second coils 11, 12 and thereby increase isolation between the adjacent coils. Likewise, connecting element 30 may increase isolation between coils 12 and 13.

The first coil 11 and the second coil 12 may be formed, for example, in a quadrangular shape as shown in FIG. 1. Alternatively, the first coil 11 and/or the second coil 12 may be formed in a circular shape, oval shape, or a polygonal shape such as triangle, pentagon or hexagon, or any other suitable shape. The first and second coils may be formed in the same shape as shown in FIG. 1. In other embodiments, the first and second coils may have differing shapes. For example, the first coil 11 may have a quadrangular shape, and the second coil 12 may have a triangular shape.

The connecting element 20 may connect the first coil 11 and second coil 12. According to one embodiment, the connecting element 20 includes a plurality of distributed connecting elements 21 to 29, which connect the first coil 11 and the second coil 12 at respective points along the peripheral surfaces of the first and second coils as shown in FIG. 1. Each of the connecting elements 21-29 may be set to one of short state and open state. In the case that the connecting element 20 has at least one of the connecting elements 21-29 in the short state, the entirety or part of the current I1 flowing through the first coil 11 or the current I2 flowing through the second coil 12 may flow into the second coil 12 or the first coil 11, respectively, through the connecting element 20. In the case that any connecting element 21-29 is in open state, the first coil 11 and the second coil 12 may not be connected to each other through that open element, and thus the current I1 flowing through the first coil 11 or the current I2 flowing through the second coil 12 may not flow into the second coil 12 or the first coil 11 through the open element.

Figure 2:
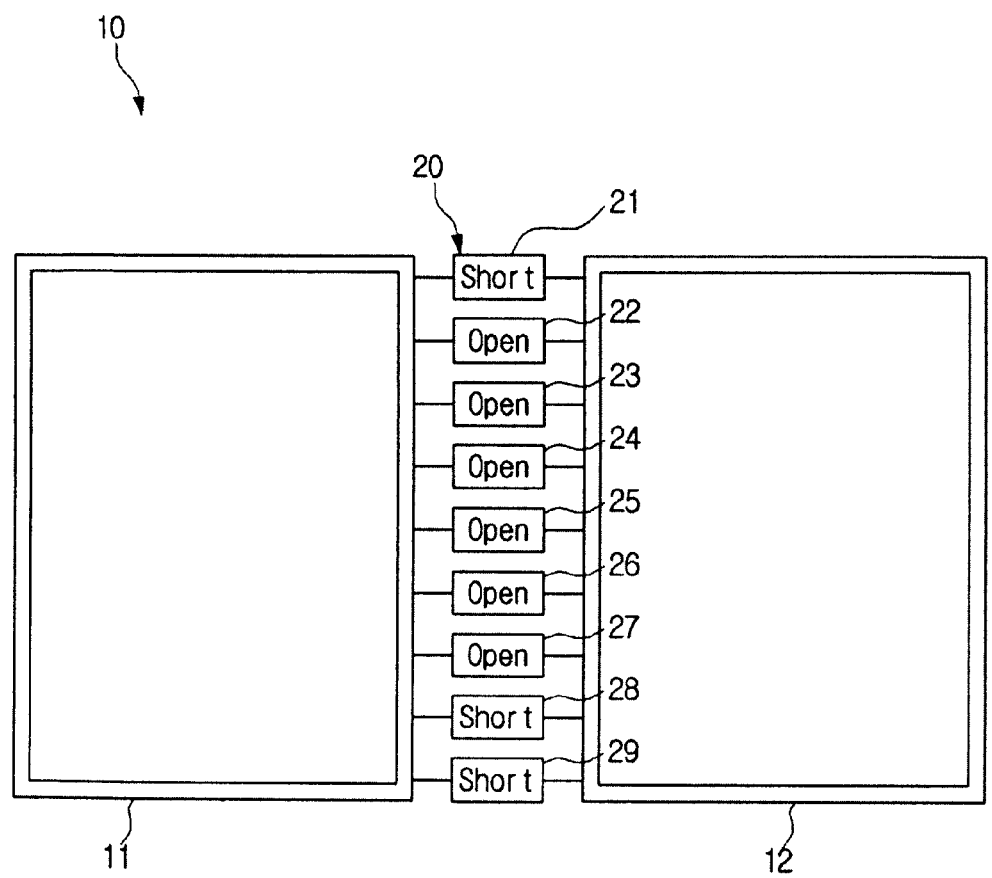
FIG. 2 and FIG. 3 are views illustrating example states of the radio frequency coil structure.
Figure 3:
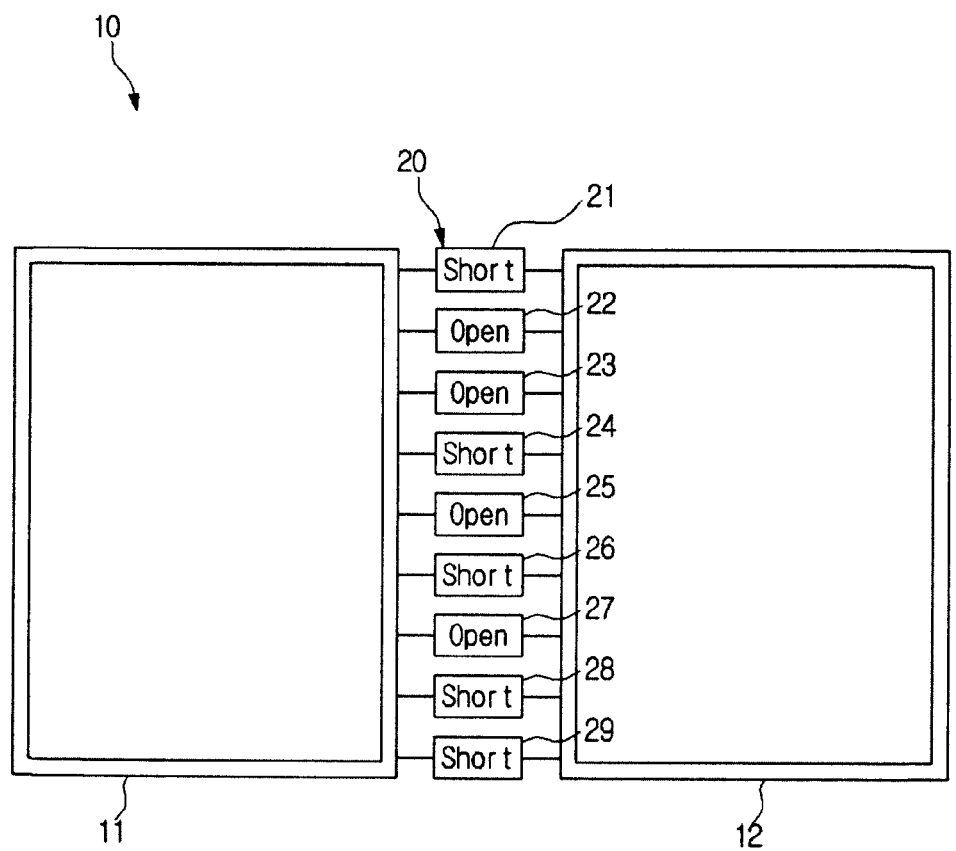

FIGS. 2 and 3 are views illustrating respective example states of the radio frequency coil structure 10. As shown in FIGS. 2 and 3, in the case that the plurality of connecting elements 21 to 29 connect the first coil 11 to the second coil 12, some connecting elements 21, 28 and 29 (FIG. 2) (or 21, 24, 26, 28 and 29 (FIG. 3)) of the plurality of the connecting elements 21 to 29 may be set to the short state, and the others 22 to 27 (FIG. 2) (or 22, 23, 25 and 27 (FIG. 3)) may be set to the open state.

In the case that the connecting elements 21 to 29 are connected to the first coil 11 and the second coil 12, the capacitance value between the first coil 11 and the second coil 12 may vary depending upon which of the connecting elements 21 to 29 are in the short state or open state. That is, the capacitance value between the first and second coils 11, 12 may be determined according to the number of connecting elements set to the short state. For example, in the case that thee connecting elements 21, 28 and 29 of the nine connecting elements 21 to 29 are set to the short state and the other six connecting elements 22 to 27 are set to the open state as shown in FIG. 2, the capacitance value between the first coil 11 and the second coil 12 may be 10 pF. In the case that five connecting elements 21, 24, 26, 28 and 29 are set to the short state and the other four connecting elements 22, 23, 25 and 27 are set to the open state as shown in FIG. 3, the capacitance value between the first coil 11 and the second coil 12 may be 15 pF. Here, the acquired capacitance value may vary depending upon the size of the first coil 11 and the second coil 12, materials of the coils 11 and 12 or conditions of the surroundings. As a result, the capacitance value between the first coil 11 and the second coil 12 may be finely adjusted according to the states of each of the connecting elements 21 to 29.

In the case that there are two neighboring coils and induced current flows through one of the coils, the induced current flowing through one of the coils generates a magnetic field, which may affect the other coil. Thereby, induced current may also flow through the other one of the neighboring coils and thus generate a magnetic field in the same manner. Thereby, neighboring coils may affect each other, resulting in mutual interference. Accordingly, if the connecting element 20 is not present, as in conventional coil arrangements, the neighboring coils would be coupled to each other, so that isolation between the coils is low. In the present embodiment, however, mutual interference between the coils 11 and 12 may be reduced or eliminated by allowing the connecting elements 21 to 29 formed between the first and second coils 11, 12 to produce a predetermined capacitance value between the first and second coils 11, 12 according to the states of the connecting elements 21 to 29. Accordingly, loss of some the induced current flowing through the first coil 11 may be prevented, and therefore the current induced in the first coil 11 according to the external magnetic field may be fully acquired. In the case that the radio frequency coil structure is applied to an apparatus such as an MRI apparatus that acquires an image signal through a current induced according to an external magnetic field, current induced only in a particular coil may be acquired without noise (or with noise significantly reduced). Similarly, isolation between neighboring coils 12 and 13 may be increased by virtue of the connecting element 30.

Figure 4:
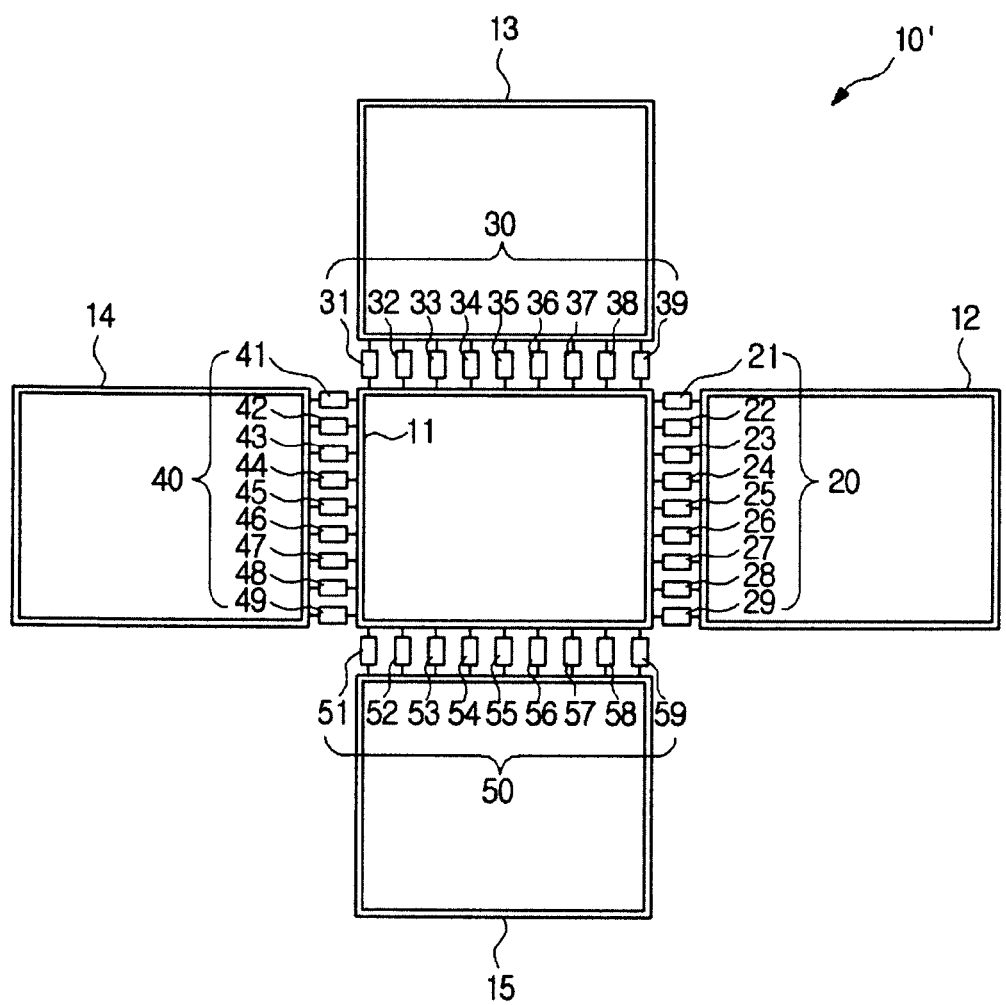
FIG. 4, FIG. 5, FIG. 6 and FIG. 7 are views illustrating a radio frequency coil structure according to various respective embodiments.

FIG. 4 is a view illustrating an RF coil structure, 10', according to one embodiment. RF coil structure 10' includes a centrally disposed first coil 11, which is connected to each of coils 12, 13, 14 and 15 via connecting elements 20, 30, 40 and 50, respectively. The first coil 11 may be connected with connecting elements 20, 30, 40 and 50 facing in a plurality of directions (where a particular direction that connecting element is said to be "facing" is the direction between a first lead on one end of the connecting element and a second lead at an opposite end of the connecting element). For example, in the case that the first coil 11 is formed in a quadrangular shape as shown in FIG. 4, the connecting elements 20 to 50 may be formed at all sides of the quadrangle facing in left, right, up and down directions relative to the centrally disposed first coil 11. According to one embodiment, the quadrangle may be provided with a plurality of connecting elements 20, 30, 40 and 50 at all sides of the quadrangle (where connecting element 40 includes distributed connecting elements 41-49 and connecting element 50 includes distributed connecting elements 51-59). (In other embodiments, one of more of the connecting elements 20, 30, 40 and 50 can be omitted.) Some of the connecting elements 21 to 59 connected to the second to fifth coils 12 to 15 may be in the short state, and the other connecting elements may be in the open state. Depending upon which of the connecting elements 21 to 59 are in the short state or open state, the capacitance values between the first coil 11 and the coils 12 to 15 may vary. In the case that the first coil 11 is formed in a circular shape according to an alternative embodiment, a plurality of connecting elements may be formed along the circumference of the first coil 11.

In the embodiments of FIGS. 1, 2, 3 and 4, neighboring first and second coils are disposed in a non-overlapping arrangement, and the connecting elements between neighboring coils may be disposed in a space between the neighboring coils.

Figure 5:
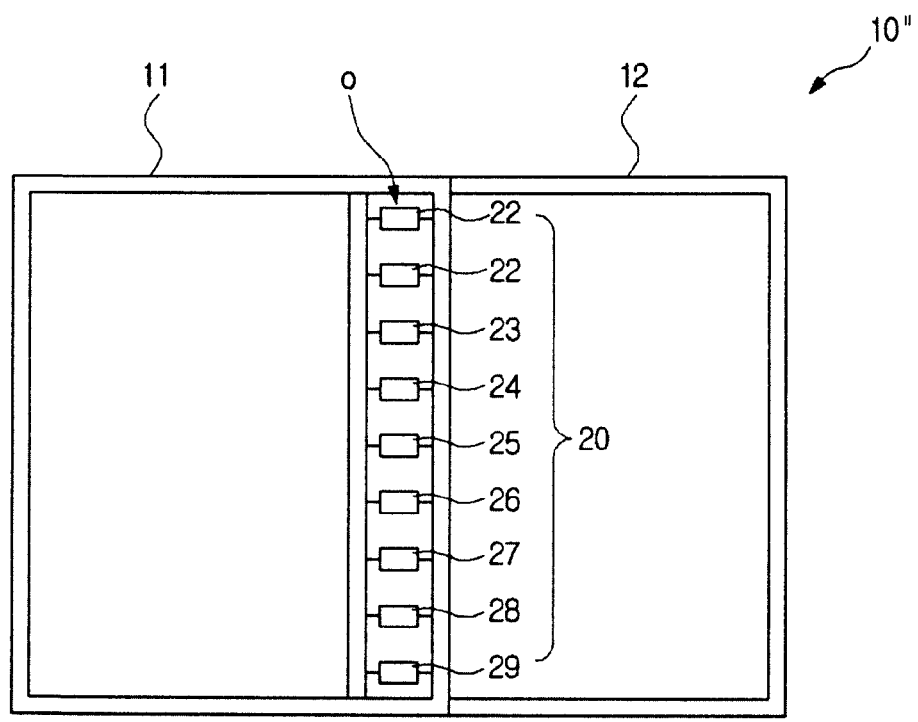

FIG. 5 is a view illustrating an RF coil structure, 10", according to another embodiment. RF coil structure 10" includes first coil 11 and second coil 12 disposed in an overlapping arrangement, so as to form an overlap region o. Here, the connecting element 20 may be positioned within this overlap region o, i.e., at the interior of at least one of the first and second coils 11, 12 as shown in FIG. 5. In the case that the connecting element 20 is formed at the interior of both the first coil 11 and the second coil 12, the first coil 11 and the second coil 12 may partially or entirely overlap (region o). In this case, the capacitance value may be determined according to which of the connecting elements 21 to 29 are in the short state or open state, or may be determined according to the position and size of the overlap region o between the first coil 11 and the second coil 12. In the case that the first coil 11 overlaps the second coil 12, currents around the overlap region o may flow in the opposite direction, resulting in cancelation of the magnetic field. Accordingly, magnetic flux mutually affecting the first and second coils 11, 12 is reduced or eliminated, and therefore interference between the overlapping coils may be reduced. By designing the overlap region o with a proper size, isolation between the first coil 11 and the second coil 12 may be enhanced.

Figure 6:
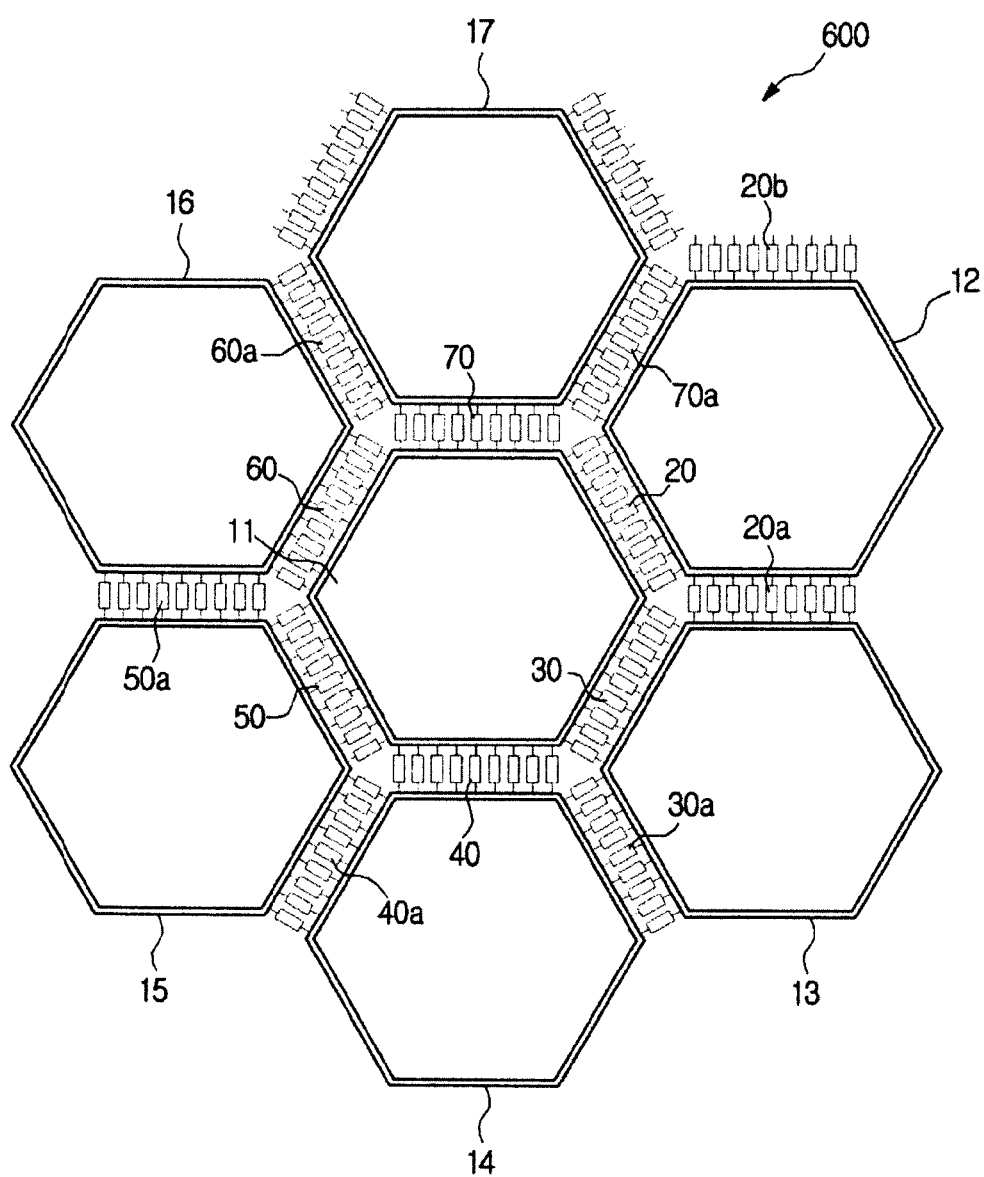

FIG. 6 is a view illustrating an RF coil structure, 600, according to yet another embodiment. As shown in FIG. 6, first to seventh coils 11 to 17 may each be formed in a hexagonal shape. In this case, the first coil 11 is centrally located and adjacent to each of the second to seventh coils 12 to 17. The first coil 11 may be connected to the second to seventh coils 12 to 17 through a plurality of connecting elements 20, 30, 40, 50, 60 and 70. In addition, each of the other coils such as the second coil 12 may also be adjacent to another coil such as the third coil 13. As in the case of the first coil 11, neighboring coils of the second to seventh coils 12 to 17 may be connected to each other through connecting elements 20a, 30a, 40a, 50a, 60a and 70a disposed therebetween. As in the embodiments described above, the capacitance value between the coils 11 to 17 adjacent to each other may be changed and adjusted according to the state of each of the distributed connecting elements of the connecting elements 20 to 70a.

Figure 7:
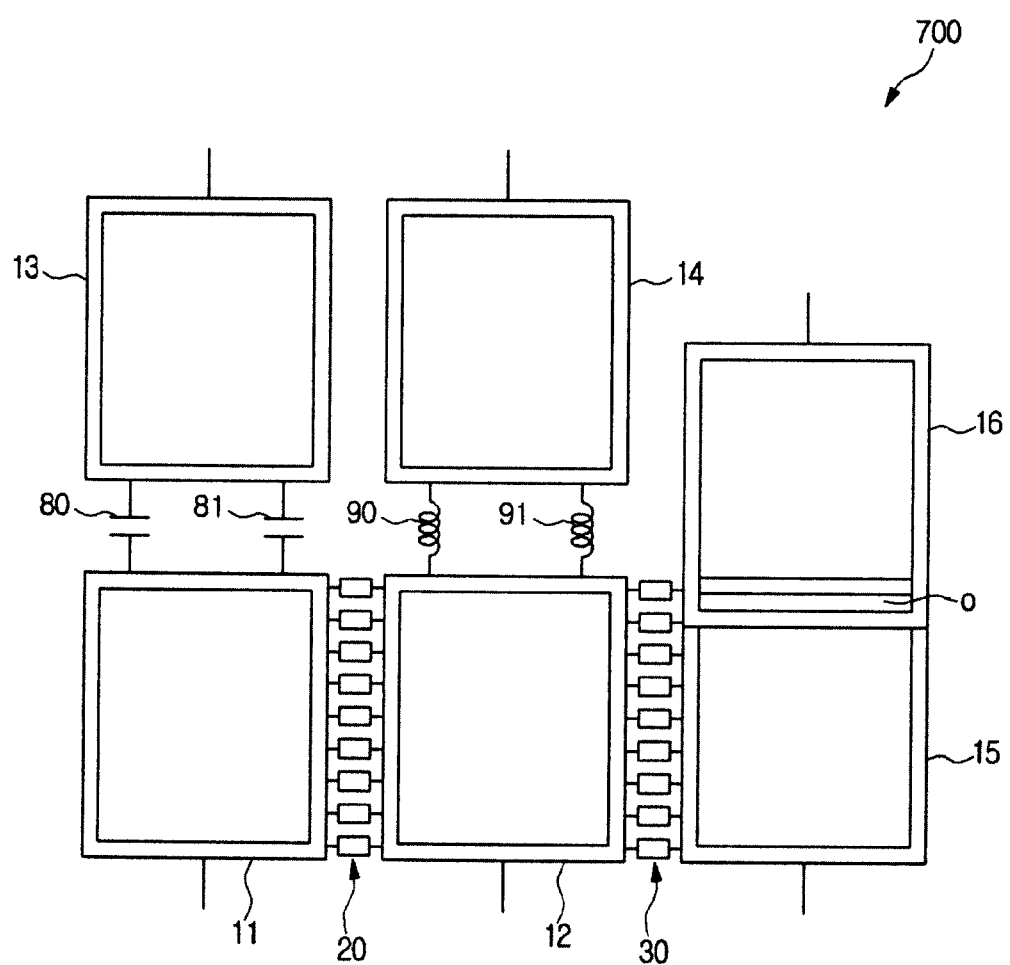

FIG. 7 is a view illustrating an RF coil structure, 700, according to another embodiment. RF coil structure 700 may enhance isolation between the coils by connecting the coils through various means or overlapping the coils. RF coil structure 700 may further include at least one of capacitors 80 and 81 and inductors 90 and 91 to connect the coils in addition to the connecting elements 20 and 30. In other words, coils 11 to 16 in the RF coil structure 700 may be connected to one another by the connecting elements 20 and 30, by the capacitors 80 and 81, and/or by the inductors 90 and 91.

For example, as shown in FIG. 7, the first coil 11 may be connected to the second coil 12 in the RF coil structure 700 by the connecting element 20, while being connected to the third coil 13 by the capacitors 80 and 81. Capacitors 80 and 81 may be decoupling capacitors, which may serve to eliminate noise by decoupling the first coil 11 and the third coil 13 to minimize mutual interference. By adjusting the values of the capacitors 80 and 81, isolation between the first coil 11 and the third coil 13 adjacent to each other may be adjusted.

In the RF coil structure 700, the second coil 12 may be connected to the first coil 11 and the fifth coil 15 through the connecting element 20 and connected to the fourth coil 14 through the inductors 90 and 91. Similar to the capacitors 80 and 81, the inductors 90 and 91 may decouple the connected coils 12 and 14. RF coil structure 700 may further include the fifth and sixth coils 15 and 16 overlapping each other. Mutual interference between the fifth and sixth coils 15 and 16 overlapping each other may be minimized as magnetic flux is eliminated according to the size of the overlap region o, as described above. In this example, no connecting element is employed within the overlap region o. Alternatively, connecting elements such as 20 shown in FIG. 5 may connect the overlapping coils.

Figure 8:
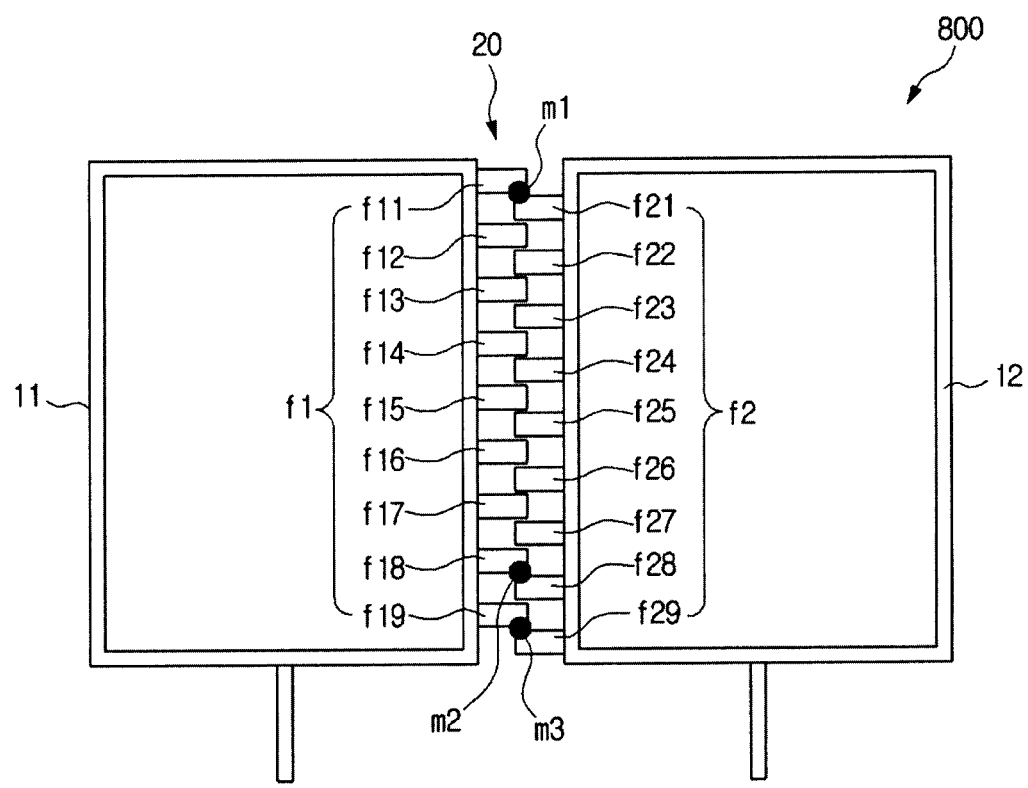
FIG. 8 and FIG. 9 are views illustrating a radio frequency coil structure with connecting elements in the form of tabs according to various embodiments.
Figure 9:
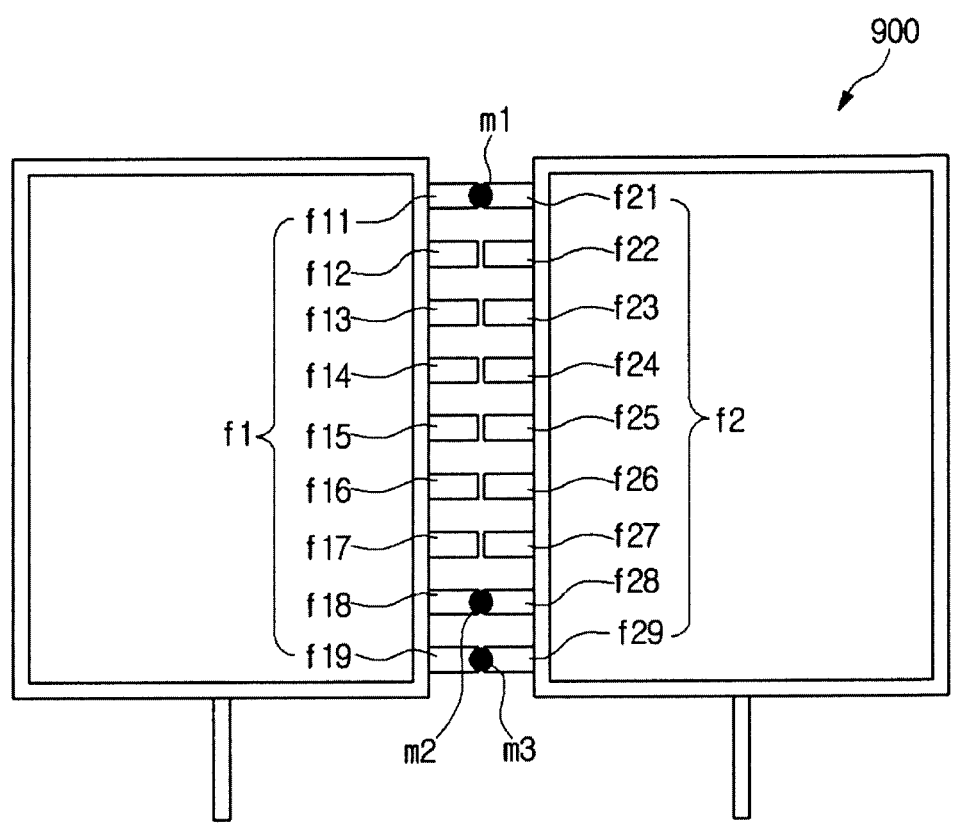

FIGS. 8 and 9 are views illustrating respective embodiments of RF coil structures provided with connecting elements in the form of tabs (or strips) according to one embodiment.

As shown in FIG. 8, the connecting element 20 may include a first set of connecting tabs f1 which is attached to and extends from the first coil 11 to face the second coil, and a second set of connecting tabs f2 attached to and extending from the second coil 12 to face the second coil. The first and second tab sets f1, f2 may be formed of the same material as that of the first and second coils 11, 12, for example, using copper (Cu). First tab set f1 may include first distributed tabs f11 through f19 attached to the first coil 11; second tab set f2 may include second distributed tabs f21 through f29 attached to the second coil 12.

The first tab set f1 may be a set of tabs extending from the first coil 11 toward the second coil 12, and the second strip f2 may be a set of tabs extending from the second coil 12 toward the first coil 11. According to one embodiment, in a non-overlapping coil arrangement, the first tab set f1 and the second tab set f2 may be formed at the exterior of the first coil 11 and the second coil 12 as shown in FIG. 8. According to another embodiment, in an overlapping coil arrangement, the first and second tab sets f1, f2 may be formed at the interior of the first coil 11 and the second coil 12 as shown in FIG. 5. The first coil 11 may be provided with the first tabs f11 to f19. Similarly, the second coil 12 may be provided with the second tabs f21 to f29.

According to one embodiment as shown in FIG. 8, the first tabs f11 to f19 and the second tabs f21 to f29 may be alternately disposed in a zigzag pattern. In this manner, the first tab set f1 and the second tab set f2 may be interleaved. According to another embodiment as shown in FIG. 9, the first tabs f11 to f19 and the second tabs f21 to f29 may be disposed facing each other. That is, positions of the first tabs and second tabs may be aligned. In the case that the first tabs f11 to f19 and the second tabs f21 to f29 are disposed in a zigzag pattern as shown in FIG. 8, each of the second tabs f21 to f29 may be disposed between neighboring ones of the first tabs f11 to f19. Accordingly, even when the distance between the first coil 11 and the second coil 12 is short, the first tabs f11 to f19 and the second tabs f21 to f29 may be disposed between the first coil 11 and the second coil 12 in an interleaved manner.

The first and second tab sets f1, f2 may each be formed with tabs in a rectangular shape as shown in FIGS. 8 and 9. Alternatively, the tabs of the first and second tab sets may be formed in the shape of semi-circle, oval, triangle, pentagon and the like. In addition, the first tabs f11 to f19 formed at the first coil 11 may or may not have the same shape. Similarly, the second tabs f21 to f29 formed at the second coil 11 may or may not have the same shape.

Referring still to FIGS. 8 and 9, some tabs f11, f18 and f19 of the first tabs f11 to f19 may be bonded to some tabs f21, f28 and f29 of the second tabs f22 to f29 by bonding elements m1 to m3. The bonding elements m1 to m3 may electrically connect the first tab set f1 and the second tab set f2 and employ an electrically conductive material. For example, the bonding elements m1 to m3 may include solder (e.g. soft solder or hard solder).

In the case that the first tabs f11, f18 and f19 are bonded to the second tab f21, f28 and f29 by the bonding elements m1 to m3, the connecting elements may be set to the short state. (A first tab attached to a first coil, and bonded to a second tab attached to a second coil, may be together considered a single connecting element set to the short state. If these first and second tabs are not bonded, this single connecting element is in an open state) On the other hand, in the case that the first tabs f12 to f17 are not bonded to the corresponding second tabs f22 to f27 by the bonding elements m1 to m3, the respective connecting elements may be set to the open state. The capacitance value may vary depending upon the number of the first tabs f11, f18 and f19 and the second tabs f21, f28 and f29 bonded to each other by the bonding elements m1 to m3. Accordingly, by changing the capacitance value according to the number of the first tabs f1 and the second tabs f2 bonded to each other, isolation between the first coil 11 and the second coil 12 may be enhanced.

A user may dispose a plurality of coils 11 and 12 provided with a plurality of tabs f11 to f19 and f21 to f29 such that they are adjacent to each other and measure capacitance value and isolation while bonding the tabs f11 to f19 and f21 to f29 formed at the coils 11 and 12 to each other using the bonding elements. Thereby, the user may deduce optimum isolation between the coils 11 and 12.

Hereinafter, a description will be given of an RF coil assembly and various embodiments of an MRI apparatus employing the radio frequency coil assembly, with reference to FIGS. 10 to 19.

Figure 10:
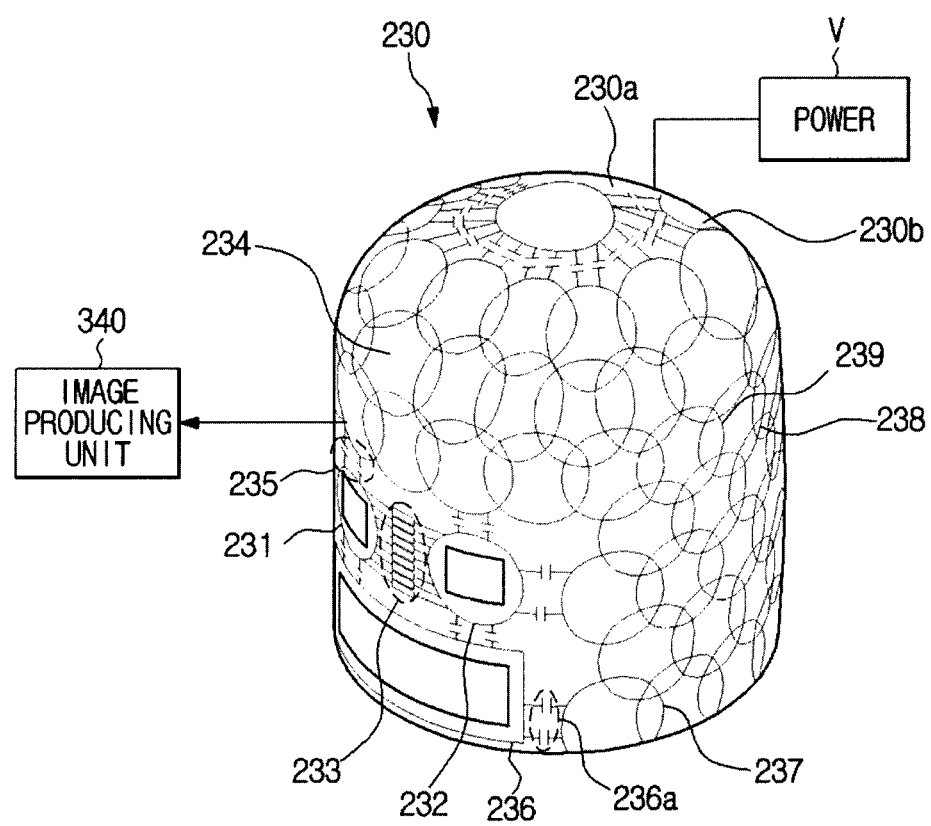
FIG. 10 is a perspective view illustrating a radio frequency coil assembly according to one embodiment.

FIG. 10 is a perspective view illustrating a radio frequency coil assembly used in an MRI apparatus according to one embodiment.

FIG. 10 exemplarily shows a helmet-shaped radio frequency coil assembly 230 as an example of a radio frequency coil assembly used in a magnetic resonance imaging apparatus. This RF coil assembly 230 may be mounted on the head of a human body and used to collect magnetic resonance signals about organs in the head such as the brain.

The helmet-shaped RF coil assembly 230 may include a substrate 230a and a plurality of coils 230b installed on the substrate 230a. The coils 230b may be transmit coils adapted to produce a high frequency magnetic field and apply the same to an object, receive coils adapted to receive magnetic resonance signals created in the object, or transceiver coils adapted to both produce a high frequency magnetic field and receive magnetic resonance signals. RF coil assembly 230 may further include a connecting element 233 to connect at least two coils 231 and 232 of the coils 130b. According to one embodiment, the assembly 230 may further include a capacitor(s) 235 installed between the at least two coils 231 and 234 of the coils 230b.

The substrate 230a may be a printed circuit board (PCB) such as a flexible PCB. The coils 230b may be uniformly installed on coil assembly 230 to collect magnetic resonance signals generated from the head of a human body in all directions.

Connecting element 233 connecting the coils 231, 232 may be embodied as any of the connecting elements 20, 30, etc. described above, with multiple distributed connecting elements. Each distributed connecting element of the connecting element 233 may be set to one of the short state and the open state, isolation between the at least two coils 231 and 232 connected to each other may vary depending upon the state of each of the distributed connecting elements. The connecting element 233 may be used to enhance isolation between the two coils 231 and 232 when it is difficult to install the two coils 231 and 232 in an overlapping manner as in the portion of the helmet-shaped radio frequency coil assembly 230 corresponding to the eyes of a human body or when the distance between the two coils 231 and 232 is short. At least two coils 231 and 234, 236 and 237 may be connected by a capacitor 235, 236a (e.g., a decoupling capacitor). Isolation between the two coils 231 and 234 may be determined according to the capacitance of the capacitor 235. At least two coils 238 and 239 of the coils 130b may overlap each other (with or without connection elements connecting the overlapping coils). Isolation between the two overlapping coils 238 and 239 may vary depending upon the size of the overlap region.

Figure 11:
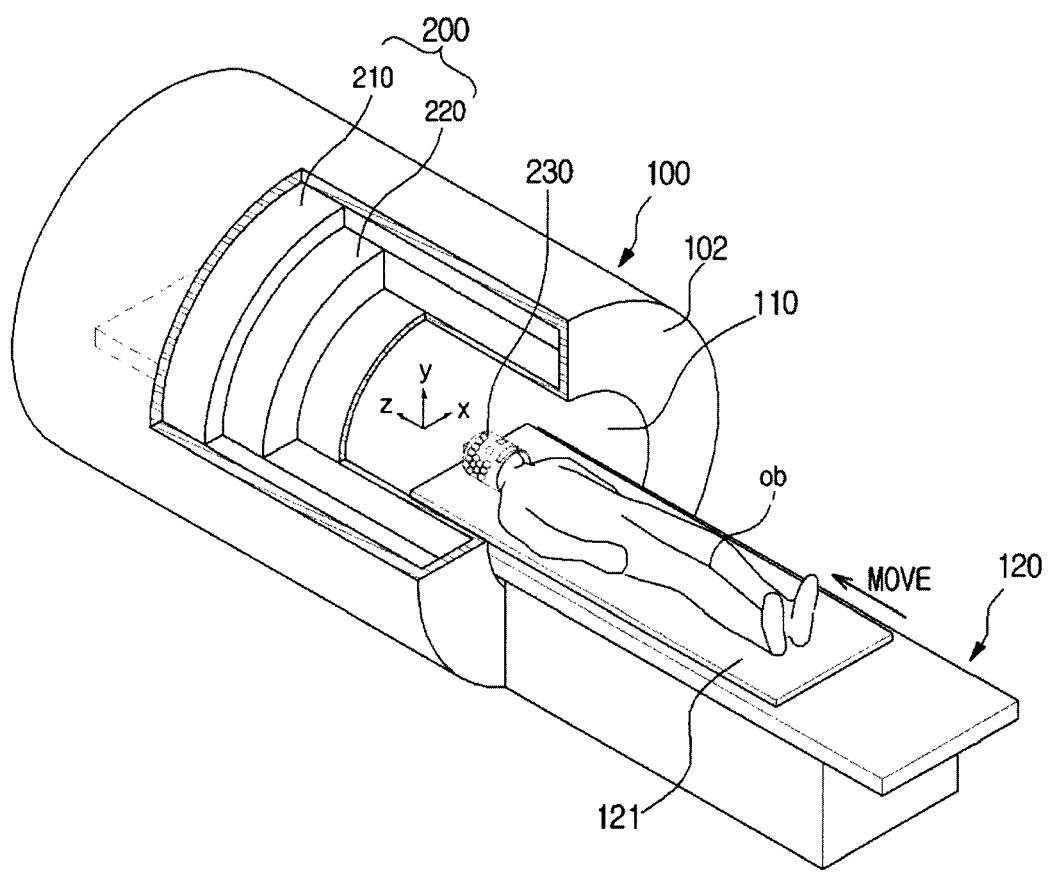
FIG. 11 is a view illustrating a magnetic resonance imaging apparatus according to one embodiment.
Figure 12:
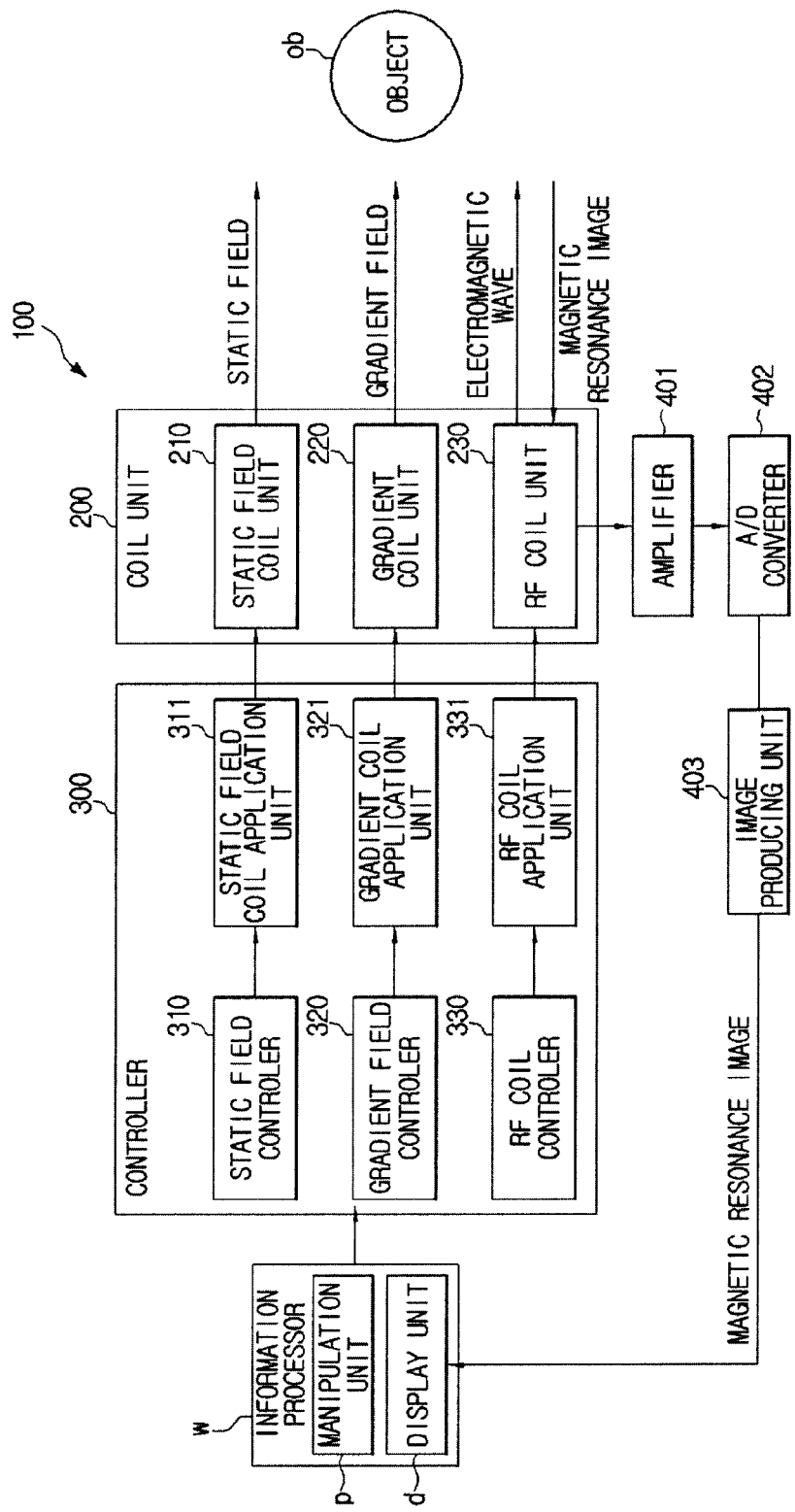
FIG. 12 is a block diagram illustrating a magnetic resonance imaging apparatus according to one embodiment.

Hereinafter, a magnetic resonance imaging apparatus 100 employing the aforementioned RF coil assembly 230 will be described. FIG. 11 is a view illustrating MRI apparatus 100 according to one embodiment, and FIG. 12 is a block diagram of MRI apparatus 100 according to one embodiment.

As shown in FIG. 11, MRI apparatus 100 may include a bore 102, which is a body of the magnetic resonance imaging apparatus 100 having a cylindrical shape. The bore 102 includes a cavity 110, which is an empty space. An object ob such as a human body may be placed on a support 121 formed on the upper surface of a moving member such as a moving table 120 and then moved and introduced into the cavity 110. The object ob moved and introduced into the cavity 110 may wear an RF coil assembly such as the helmet shaped coil assembly 230 mounted on the head of the object ob.

A coil unit 200 may be installed in the bore 102. Specifically, a static field coil unit 210 and a gradient coil unit 220 may be installed in the bore 102. The RF coil unit 230 (which may be considered part of the coil unit 200) may be worn on a part of the object ob and moved into the bore 102.

The coil unit 200 may create a magnetic field in the object ob in the cavity or apply electromagnetic waves to the object ob to induce magnetic resonance of nuclei inside the object ob and receive a magnetic resonance signal generated according to the magnetic resonance. Magnetic resonance is a phenomenon in which nuclei resonate at a certain frequency of an electromagnetic wave applied thereto. Hereinafter, the magnetic resonance phenomenon will be specifically described. A nucleus of an element such as hydrogen (H), phosphorus (P), sodium (Na), or carbon isotope (C) inside the object ob such as a human body has a certain spin. When the nucleus is exposed to an external magnetic field and thus magnetized, the spin of the nucleus is aligned in the direction of the magnetic field. In addition, the spin is caused by torque applied thereto by the magnetic field, to implement precession by quickly rotating at a Larmor frequency, forming a predetermined angle with the central axis. The Larmor frequency may vary depending on the strength of the external magnetic field and the type of the nucleus. When an electromagnetic wave with a frequency identical or similar to the Larmor frequency is applied to a nucleus during precession of the nucleus, the magnetization vector of the nucleus resonates and is thus oriented perpendicular to the static magnetic field. At this time, the magnetization vector induces free induction decay (FID) in an adjacent radio frequency (RF) coil. This phenomenon is called nuclear magnetic resonance. The coil unit 200 produces an image of a target portion in the object ob such as a human body based on an induced voltage signal and provides the produced image to the user.

As shown in FIGS. 11 and 12, the coil unit 200 may include the static field coil unit 210, the gradient coil unit 220 and the RF coil unit 230. The static field coil unit 210 and the gradient coil unit 220 may be installed in the bore 102 as shown in FIG. 11. The gradient coil unit 220 may include, as shown in FIG. 14, an x-axis gradient coil 221, a y-axis gradient coil 222 and a z-axis gradient coil 223.

Figure 13:
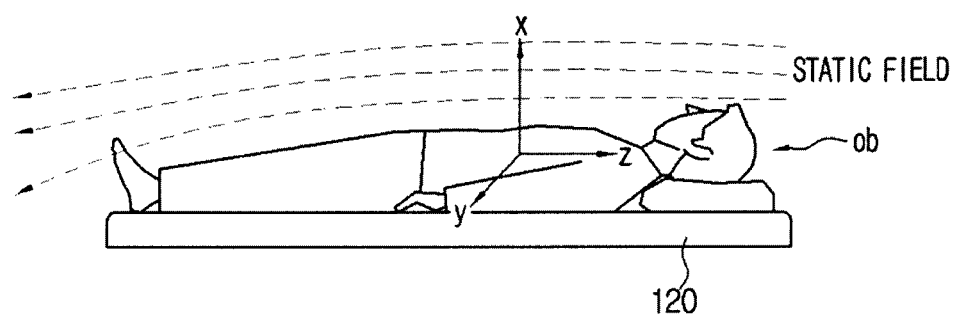
FIG. 13, FIG. 14 and FIG. 15 are views illustrating a process of the magnetic resonance imaging apparatus acquiring a magnetic resonance signal.

FIG. 13 is a view illustrating a static magnetic field of a magnetic resonance imaging apparatus produced by the static field coil unit 210. The static field coil unit 210 may produce a static magnetic field to magnetize nuclei of elements distributed in a human body such as, for example, hydrogen, phosphorous and sodium which causes magnetic resonance. The static magnetic field may be produced by the static field coil unit 210 in a direction parallel to movement of the object ob. Accordingly, in the case that the object ob is a human body, a static magnetic field may be created from the head of the human body toward the legs. The static field coil unit 210 may be made of superconducting electromagnets or permanent magnets. When a nucleus of an element such as hydrogen, phosphorus and sodium is exposed to a static magnetic field, it is magnetized, and the magnetization vector of the nucleus precesses around the static magnetic field. The gradient coil unit 220 may produce spatially linear gradient fields Gx, Gy and Gz in the object ob in the cavity to change uniformity of the magnetic field. Thereby, when the magnetization vector of a nucleus of an element such as hydrogen, phosphorus and sodium produced by a main magnetic field rotates in a transverse plane, the gradient coils 221 to 223 spatially control the rotation frequency and phase of the rotating magnetization vector such that a magnetic resonance signal is depicted in the k-space, the spatial frequency domain.

Figure 14:
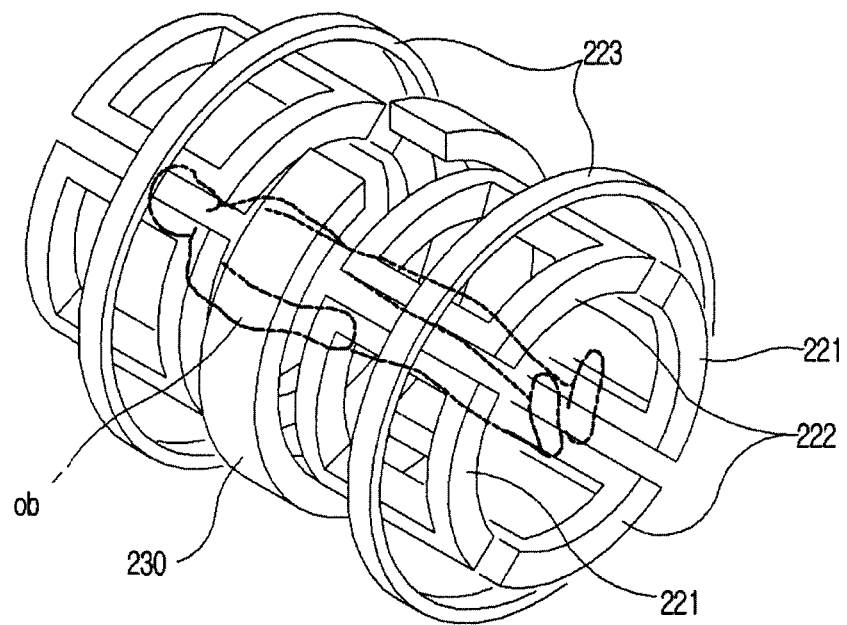

FIG. 14 is a view illustrating a gradient coil unit of a magnetic resonance imaging apparatus according to one embodiment. The gradient coil unit 220 may include three gradient coils 221 to 223 to create gradient fields in the x-axis, y-axis or z-axis to capture a magnetic resonance image, as shown in FIG. 14. The gradient coils 221 to 223 may produce gradient fields Gx, Gy and Gz having different gradients in different directions. The z-axis gradient coil 223 may produce a slice-select gradient Gz in the z-axis direction which is used for selection of a slice. The y-axis gradient coil 222 may produce a phase-encoding gradient in the y-axis direction to cause phase shift such that rows of the slice have different phases for phase encoding. The x-axis gradient coil 221 may produce a frequency-encoding gradient Gx in the x-axis direction which allows spins in respective rows to have different frequencies such that the spins are distinguishable from each other.

Figure 15:
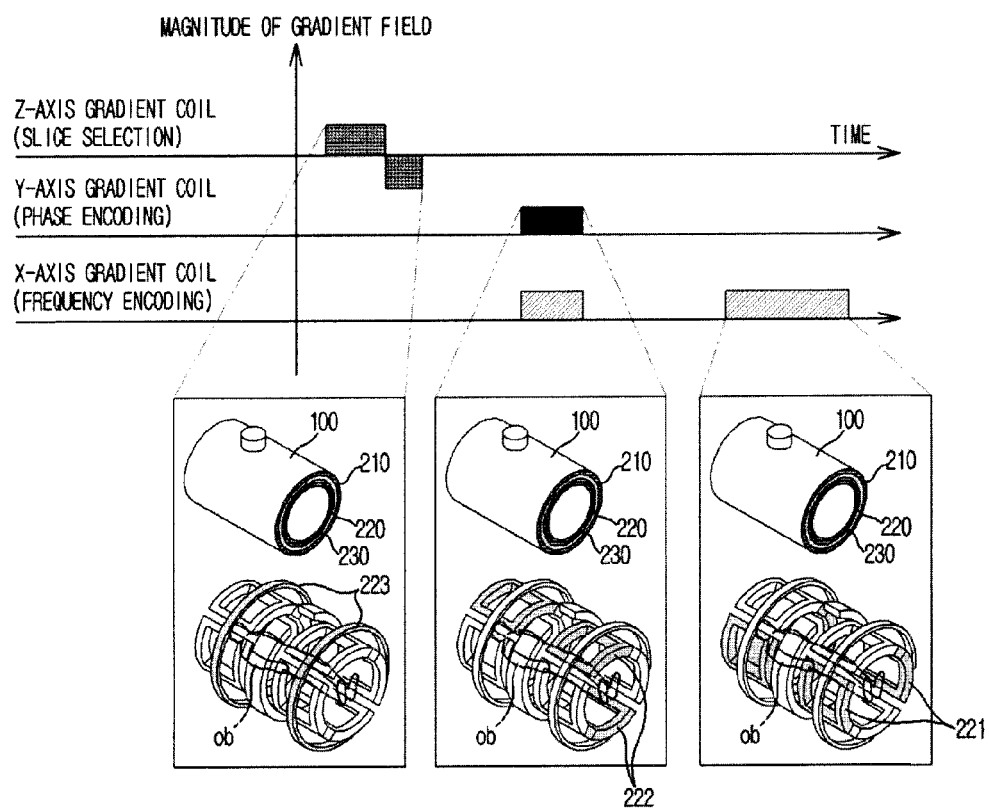

FIG. 15 is a view illustrating pulse sequences of the respective gradient coils. As shown in FIG. 15, the z-axis gradient coil 223 may create the gradient field Gz in the z-axis direction such that for a human body provided as the object ob, the strength of the magnetic field decreases from the head to the legs to form a magnetic field having a predetermined gradient in the z-axis direction. In this case, the radio frequency coil unit 230 transmits a radio frequency pulse having a predetermined frequency, magnetic resonance signals are generated from slices subjected to the magnetic field within the frequency range of the transmitted radio frequency pulse to allow selection of a slice. At this time, all the spins of a selected slice have the same frequency and same phase and are thus indistinguishable from each other. The y-axis gradient coil 222 may create a phase-encoding gradient Gy in the y-axis direction. Different phase shift may be imparted to the spins of each slice according to the phase-encoding gradient. In other words, when the y-axis gradient is created, the phase of the spins with higher gradient may change to higher frequency, and the phase of the spins with lower gradient may change to a lower frequency. When the y-axis gradient is interrupted, all the spins may precess at a predetermined frequency. However, permanent phase shift may be caused by the y-axis gradient, and therefore the spins may become distinguishable from each other (phase encoding). During acquisition of magnetic resonance signals, the x-axis gradient coil 221 may apply the frequency encoding gradient Gx to the object ob in the x-axis direction. In the case that the slices are expressed in a predetermined matrix, the spins from different rows may be given different frequencies such that the spins are distinguished from each other (frequency encoding).

When static and gradient fields are applied to the object ob, the radio frequency coil unit 230 may produce a high frequency magnetic field such that a magnetization vector produced by the static field rotates on a transverse plane in a parallel relationship with the plane. According to one embodiment, a transmit coil and a receive coil (not shown) may be separately provided to the radio frequency coil unit 230. In this case, a high frequency magnetic field may be produced by the transmit coil. According to another embodiment, the radio frequency coil unit 230 may include a transceive coil. In this case, the transceive coil may produce a high frequency magnetic field. The radio frequency coil unit 230 may be a helmet-shaped radio frequency coil assembly as shown in FIGS. 10 and 11. When a high frequency current in the Larmor frequency band is applied to the radio frequency coil unit 230, the high frequency coil of the radio frequency coil unit 230 may produce a magnetic field rotating around the coil at the Larmor frequency according to the applied high frequency current in the Larmor frequency band. At this time, in the case that the rotating magnetic field resonates with the magnetization vector of a target portion in the object ob, the magnetization vector of the target portion is horizontally inclined with respect to the transverse plane and rotates at the Larmor frequency. As the magnetization vector rotates, a predetermined electromotive force is induced in the receive coil or the transceive coil of the radio frequency coil unit 230. In the case that a sine wave of the Larmor frequency is demodulated based on the induced electromotive force signal, a magnetic resonance signal of a base band may be obtained. Thereby, the radio frequency coil unit 230 may acquire a magnetic resonance signal for the target portion inside or outside the object ob. Here, in the case that the radio frequency coil unit 230 is a helmet-shaped radio frequency coil assembly 230 as shown in FIGS. 10 and 11, interference between the coils may be reduced or eliminated, and therefore a proper magnetic resonance signal may be acquired from each coil 230b of the radio frequency coil assembly 230.

As shown in FIG. 12, the magnetic resonance imaging apparatus 100 may further include a controller 300. The controller 300 may produce a control signal to control operation of the coil unit 200. Specifically, the controller 300 may include a static field controller 310 to control the static field coil unit 210, a gradient field controller 320 to control the gradient coil unit 220, and a radio frequency coil controller 330 to control the radio frequency coil unit 230. The static field controller 310, gradient field controller 320 and radio frequency coil controller 330 may respectively produce control signals according to a user instruction or command entered through a manipulation unit p such as an information processor w or according to pre-stored settings and then transmit the produced control signals respectively to a static field coil application unit 311, a gradient coil application unit 321 and a radio frequency coil application unit 331. The static field coil application unit 311, gradient coil application unit 321 and radio frequency coil application unit 331 may respectively apply currents to the static field coil unit 210, the gradient coil unit 220 and the radio frequency coil unit 230 based on the control signals to acquire magnetic resonance signals.

As shown in FIG. 12, the magnetic resonance imaging apparatus 100 may further include an amplifier 401 to amplify an analog magnetic resonance signal output from the radio frequency coil unit 230 and an analog/digital (A/D) converter 402 to covert an analog signal output from the amplifier 401 to a digital signal, when necessary.

An image producing unit 403 may produce a magnetic resonance image based on the magnetic resonance signal output from the A/D converter 402.

Specifically, the image producing unit 403 may create a k-space based on a magnetic resonance signal and Fourier-transform the created k-space to produce a magnetic resonance image. When necessary, the image producing unit 403 may correct the produced magnetic resonance image by adjusting brightness, sharpness or contrast of the entirety or part of the magnetic resonance image. The corrected magnetic resonance image may be shown to the user through a display unit d installed at such a constituent as an information processor w.

Figure 16:
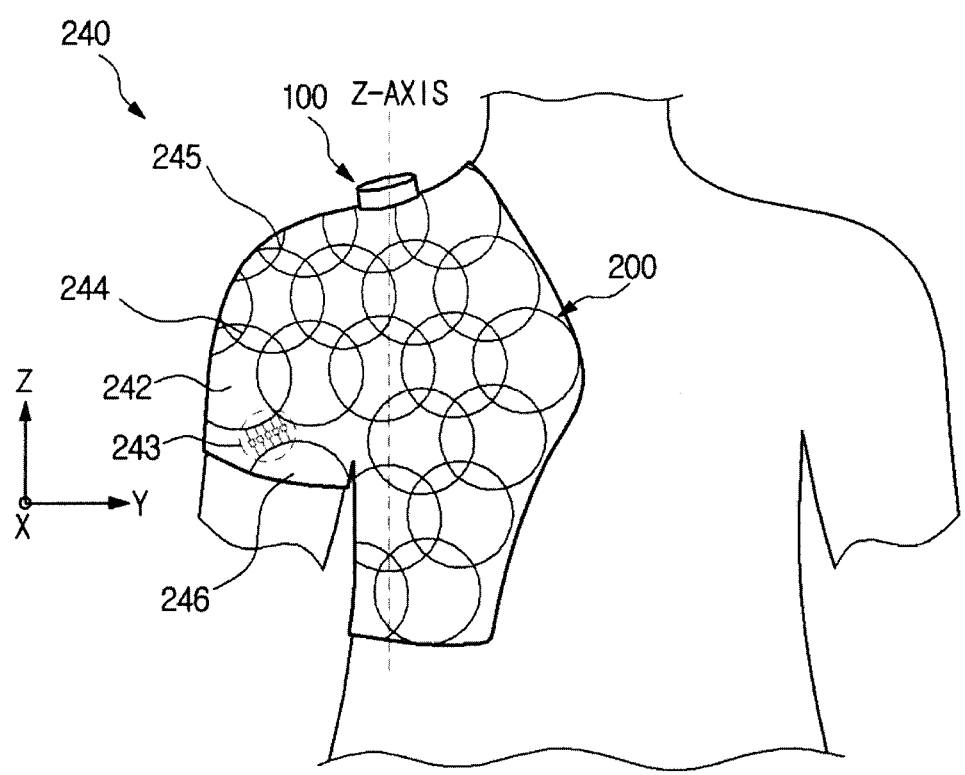
FIG. 16 is a view illustrating a radio frequency coil assembly according to another embodiment.
Figure 17:
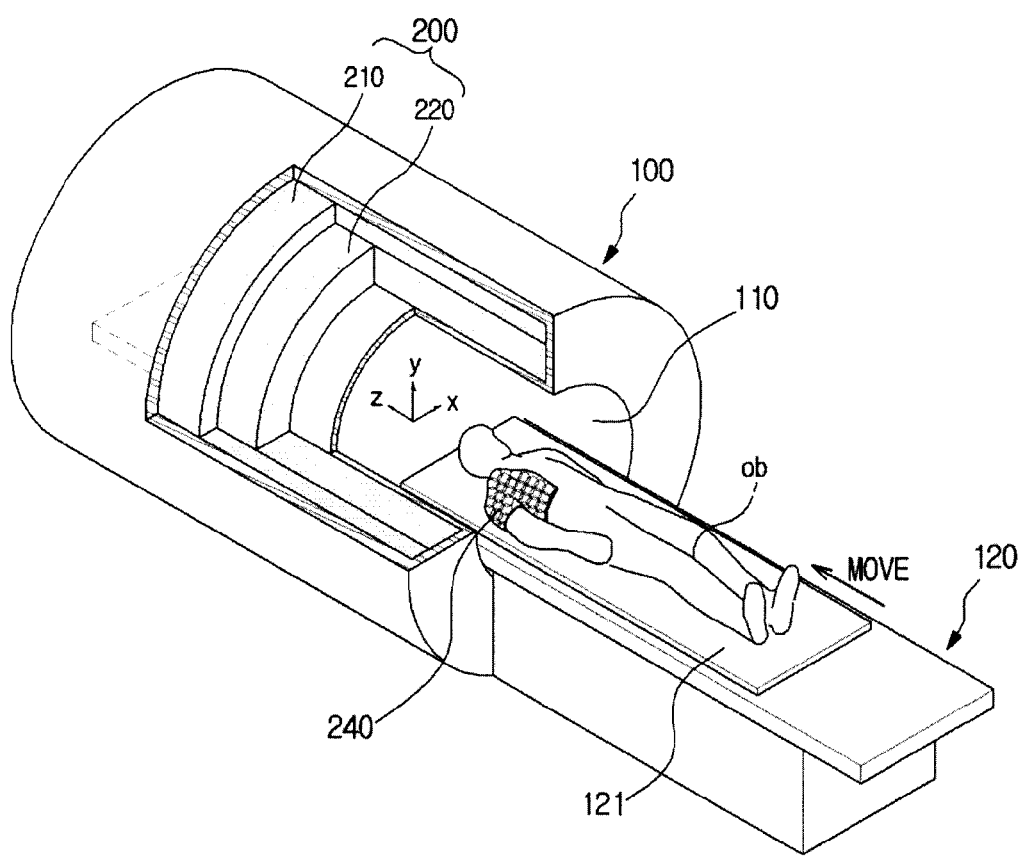
FIG. 17 is a view illustrating a magnetic resonance imaging apparatus according to another embodiment.

FIG. 16 is a view illustrating an RF coil assembly, 240, according to another embodiment, and FIG. 17 is a view illustrating a magnetic resonance imaging apparatus according to another embodiment.

As shown in FIG. 16, the RF coil assembly 240 may take the form of a shoulder-chest guard mounted on the shoulder and chest of a human body. The radio frequency coil assembly 240 taking the form of a shoulder-chest guard may include a plurality of coils such as 241, 242, 244 and 255. The coils 241 and 242 may be connected to each other through a connecting element 243, which may be embodied as any of the connecting elements 20, 30, etc. described above, with multiple distributed connecting elements. Each of the distributed connecting elements may be set to one of the short state and the open state. Depending on the states of the connecting element 243, isolation between the coils 241 and 242 connected to each other may vary. In addition, the coils 244 and 245 of the radio frequency coil assembly 240 may overlap each other. Interference between the coils 244 and 245 may vary depending upon the size of the overlap region between the coils 244 and 245. According to one embodiment, the radio frequency coil assembly 240 may further include a capacitor or an inductor installed between the coils.

As shown in FIG. 17, the radio frequency coil assembly 240 taking the form of a shoulder-chest guard may be mounted on the shoulder and chest of an object ob such as a human body, and the object ob may be moved into the cavity 110 formed in the bore 100 by, for example, the moving table 120. As described above, a static field and a gradient field may be produced in the cavity 110 by a static field producing unit 210 and a gradient producing unit 220. The radio frequency coil assembly 240 may apply an electromagnetic wave to the object ob and then collect magnetic resonance signals from the magnetic fields in the object ob.

In addition to the helmet-shaped RF coil assembly 230 and the RF coil assembly 240 taking the form of a shoulder-chest guard, a radio frequency coil assembly 10 may take various forms according to a part on which the radio frequency coil assembly 10 is worn. The part on which the radio frequency coil assembly 10 is worn may include, for example, the waist, femoral region, upper arm, and forearm of a human body. RF coil assembly 10 may take a form corresponding to the part on which the it is worn, such that a proper slice image is acquired from the part and the RF coil assembly 10 is easily worn on the part.

As is apparent from the above description, with a radio frequency coil structure and a radio frequency coil assembly according to the illustrated embodiments, isolation between radio frequency coils in the radio frequency coil assembly may be economically and readily enhanced.

With the illustrated magnetic resonance imaging apparatus, interference between radio frequency coils may be quickly and easily optimized in an appropriate manner. Therefore, a desired signal may be more correctly acquired.

With the illustrated radio frequency coil structure and radio frequency coil assembly, time taken to manufacture the radio frequency coil assembly used for a magnetic resonance imaging apparatus may be reduced, and manufacturing costs may also be reduced. Thereby, manufacturing the radio frequency coil assembly may become economically feasible. Therefore, mass production of radio frequency coil assemblies may be improved.

In addition, with the illustrated radio frequency coil structure and radio frequency coil assembly, capacitance between radio frequency coils may be easily and finely adjusted to a value most proper for acquisition of magnetic resonance signals.

In addition, with the illustrated radio frequency coil structure and radio frequency coil assembly, radio frequency coils may be disposed in the radio frequency coil assembly without spatial restriction such that interference rarely occurs between the radio frequency coils. Therefore, a magnetic resonance signal may be acquired at various positions.

Moreover, with the illustrated radio frequency coil structure and radio frequency coil assembly, the size of a loop of a radio frequency coil may be kept constant regardless of the level of interference. Accordingly, degradation of performance of blocking interference between radio frequency coils of the radio frequency coil assembly according to manufacturing tolerances may be easily addressed.

Although a few embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A radio frequency coil assembly comprising:
a plurality of coils; and
a plurality of distributed connecting elements to be physically connected to each of a first coil and a second coil of the coils, each of the connecting elements being set to one of a short state and an open state,
wherein isolation between the first coil and the second coil varies depending upon the state of each of the connecting elements,
wherein, when the connecting element is set to the short state, current flows between the first coil and the second coil though the connecting element, and
when the connecting element is set to the open state, the flow of the current between the first coil and the second coil though the connecting element is cut off.

2. The radio frequency coil assembly according to claim 1, wherein a portion of the connecting elements is set to the short state and a remaining portion of the connecting elements is set to the open state.

3. The radio frequency coil assembly according to claim 1, wherein each coil of the plurality of coils has a circular shape, an oval shape, or a polygonal shape.

4. The radio frequency coil assembly according to claim 1, wherein the first and second coils are disposed in a non-overlapping relationship, and the plurality of connecting elements are disposed in between the first and second coils.

5. The radio frequency coil assembly according to claim 1, wherein at the plurality of connecting elements are disposed in a region within at least one of the first coil and the second coil.

6. The radio frequency coil assembly according to claim 5, wherein the first coil and the second coil overlap each other, and the connecting elements are disposed in an overlapping region therebetween.

7. The radio frequency coil assembly according to claim 1, wherein the connecting elements comprise a first set of spaced apart first tabs attached to the first coil and a second set of spaced apart second tabs attached to the second coil.

8. The radio frequency coil assembly according to claim 7, wherein the first set of tabs is attached at the first coil to face the second coil, and the second set of tabs is attached at the second coil to face the first coil.

9. The radio frequency coil assembly according to claim 8, wherein the first tabs alternate in position with respect to the second tabs, so that the first set of tabs and the second set of tabs are interleaved.

10. The radio frequency coil assembly according to claim 8, wherein the first tabs are aligned with respective ones of the second tabs so that the first set of tabs and the second set of tabs face each other.

11. The radio frequency coil assembly according to claim 7, wherein, when a first tab and a second tab are bonded to each other, the first and second tabs form a connecting element that is set to the short state.

12. The radio frequency coil assembly according to claim 11, wherein the connecting elements comprise a bonding element to bond a first tab to a corresponding second tab, the bonded first and second tabs together forming one of the connecting elements in the short state.

13. The radio frequency coil assembly according to claim 1, further comprising at least one of a capacitor connected to at least two coils of the plurality of coils and an inductor connected to at least two coils of the plurality of coils.

14. The radio frequency coil assembly according to claim 1, wherein at least two coils of the plurality of coils overlap each other without any connection therebetween.

15. The radio frequency coil assembly according to claim 1, wherein the plurality of coils comprise at least one of a transmit coil, a receive coil and a transceive coil.

16. A magnetic resonance imaging apparatus comprising:
a static field coil unit to create a static field for an object;
a gradient coil unit to create a gradient for the object;
a transmit coil unit to apply an electromagnetic wave to an object exposed to the static field and the gradient to induce magnetic resonance in the object; and
a receive coil unit to receive a magnetic resonance signal generated according to the induced magnetic resonance,
wherein at least one of the transmit coil unit and the receive coil unit comprises a plurality of coils and a plurality of distributed connecting elements to be physically connected to each of a first coil and a second coil of the coils, each of the connecting elements being set to one of a short state and an open state,
wherein, when the connecting element is set to the short state, current flows between the first coil and the second coil though the connecting element, and
when the connecting element is set to the open state, the flow of the current between the first coil and the second coil though the connecting element is cut off.

17. The magnetic resonance imaging apparatus according to claim 16, wherein a portion of the connecting elements is set to the short state, and a remaining portion of the connecting elements is set to the open state.

18. The magnetic resonance imaging apparatus according to claim 16, comprising a helmet shaped radio frequency coil assembly which includes the plurality of coils.

19. A magnetic resonance imaging apparatus comprising:
a static field coil unit to create a static field for an object;
a gradient coil unit to create a gradient for the object; and
a radio frequency coil unit to apply an electromagnetic wave to an object exposed to the static field and the gradient to induce magnetic resonance in the object and to receive a magnetic resonance signal generated according to the induced magnetic resonance,
wherein the radio frequency coil unit comprises a plurality of coils and a plurality of connecting elements to be physically connected to each of a first coil and a second coil of the coils, each of the connecting elements being set to one of a short state and an open state,
wherein, when the connecting element is set to the short state, current flows between the first coil and the second coil though the connecting element, and
when the connecting element is set to the open state, the flow of the current between the first coil and the second coil though the connecting element is cut off.

20. The magnetic resonance imaging apparatus of claim 19, wherein the radio frequency coil unit is an assembly in a shape conforming to a predetermined body part.

* * * * *